(12) United States Patent
Furukawa et al.

(10) Patent No.: US 6,282,115 B1
(45) Date of Patent: Aug. 28, 2001

(54) MULTI-LEVEL DRAM TRENCH STORE UTILIZING TWO CAPACITORS AND TWO PLATES

(75) Inventors: Toshiharu Furukawa; David V. Horak, both of Essex Junction; Howard L. Kalter, Colchester, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/469,275

(22) Filed: Dec. 22, 1999

(51) Int. Cl.$^7$ .................................................. G11C 11/24
(52) U.S. Cl. ............................................................ 365/149
(58) Field of Search .................................. 365/149, 145, 365/68, 69, 51, 52

(56) References Cited

U.S. PATENT DOCUMENTS

| | | | |
|---|---|---|---|
| 3,979,734 | 9/1976 | Pricer et al. | 340/173 |
| 4,306,300 | 12/1981 | Terman et al. | 365/45 |
| 4,574,365 | 3/1986 | Scheuerlein | 365/149 |
| 5,250,827 | 10/1993 | Inoue et al. | 257/295 |
| 5,291,436 | 3/1994 | Kamisawa | 365/145 |
| 5,357,460 | * 10/1994 | Yusuki et al. | 365/145 |
| 5,414,653 | * 5/1995 | Onishi et al. | 365/145 |
| 5,424,975 | 6/1995 | Lowrey et al. | 365/145 |
| 5,541,872 | * 7/1996 | Lowrey et al. | 365/145 |

* cited by examiner

Primary Examiner—Richard Elms
Assistant Examiner—Anh Phung
(74) Attorney, Agent, or Firm—McGuireWoods, LLP; Eugene I. Shkurko

(57) ABSTRACT

A multi-level memory cell capable of storing two or three bits of digital data occupies only four lithographic squares and requires only one or two logic level voltage sources, respectively. High noise immunity derives from integration of the multi-level signal in the memory cell directly from logic level digital signals applied to two capacitors (as well as the bit line for the eight level mode of operation) by using capacitors having different values in order to avoid digital-to-analog conversion during writing. The capacitors can be simultaneously written and read to reduce memory cycle time. Transistor channels and capacitor connections are formed on adjacent semiconductor pillars using plugs of semiconductor material between pillars as common gate structures and connections. Opposite surfaces of the pillars also serve as storage nodes with common capacitor plates formed by conformal deposition between rows of plugs and pillars.

11 Claims, 18 Drawing Sheets

| | Voltage Level | | | | | Electron Charge Value | | | |
|---|---|---|---|---|---|---|---|---|---|
| BL | A | B | C1 | C2 | C1 | C2 | DATA |
| 0 | 1 | 1 | 0 | 0 | 0 | 0 | 0 |
| 0 | 1 | 0 | 0 | 1 | 0 | 0.5 | 0.5 |
| 0 | 0 | 1 | 1 | 0 | 1 | 0 | 1 |
| 0 | 0 | 0 | 1 | 1 | 1 | 0.5 | 1.5 |
| 2 | 1 | 1 | 2 | 2 | 2 | 1 | 3 |
| 2 | 1 | 0 | 2 | 3 | 2 | 1.5 | 3.5 |
| 2 | 0 | 1 | 3 | 2 | 3 | 1 | 4 |
| 2 | 0 | 0 | 3 | 3 | 3 | 1.5 | 4.5 |

FIG. 2A

| | Voltage Level | | | | | Electron Charge Value | | | |
|---|---|---|---|---|---|---|---|---|---|
| BL | A | B | C1 | C2 | C1 | C2 | DATA |
| Version 1 | | | | | | | |
| 0 | 1 | 1 | 0 | 0 | 0 | 0 | 0 |
| 0 | 1 | 0 | 0 | 1 | 0 | 0.5 | 0.5 |
| 0 | 0 | 1 | 1 | 0 | 1 | 0 | 1 |
| 0 | 0 | 0 | 1 | 1 | 1 | 0.5 | 1.5 |
| Version 2 | | | | | | | |
| 0 | 1 | 1 | 0 | 0 | 0 | 0 | 0 |
| 0 | 1 | 0 | 0 | 1 | 0 | 0.5 | 0.5 |
| 1 | 1 | 1 | 1 | 2 | 1 | 0.5 | 1.5 |
| 1 | 1 | 0 | 1 | 2 | 1 | 1 | 2 |

FIG. 2B

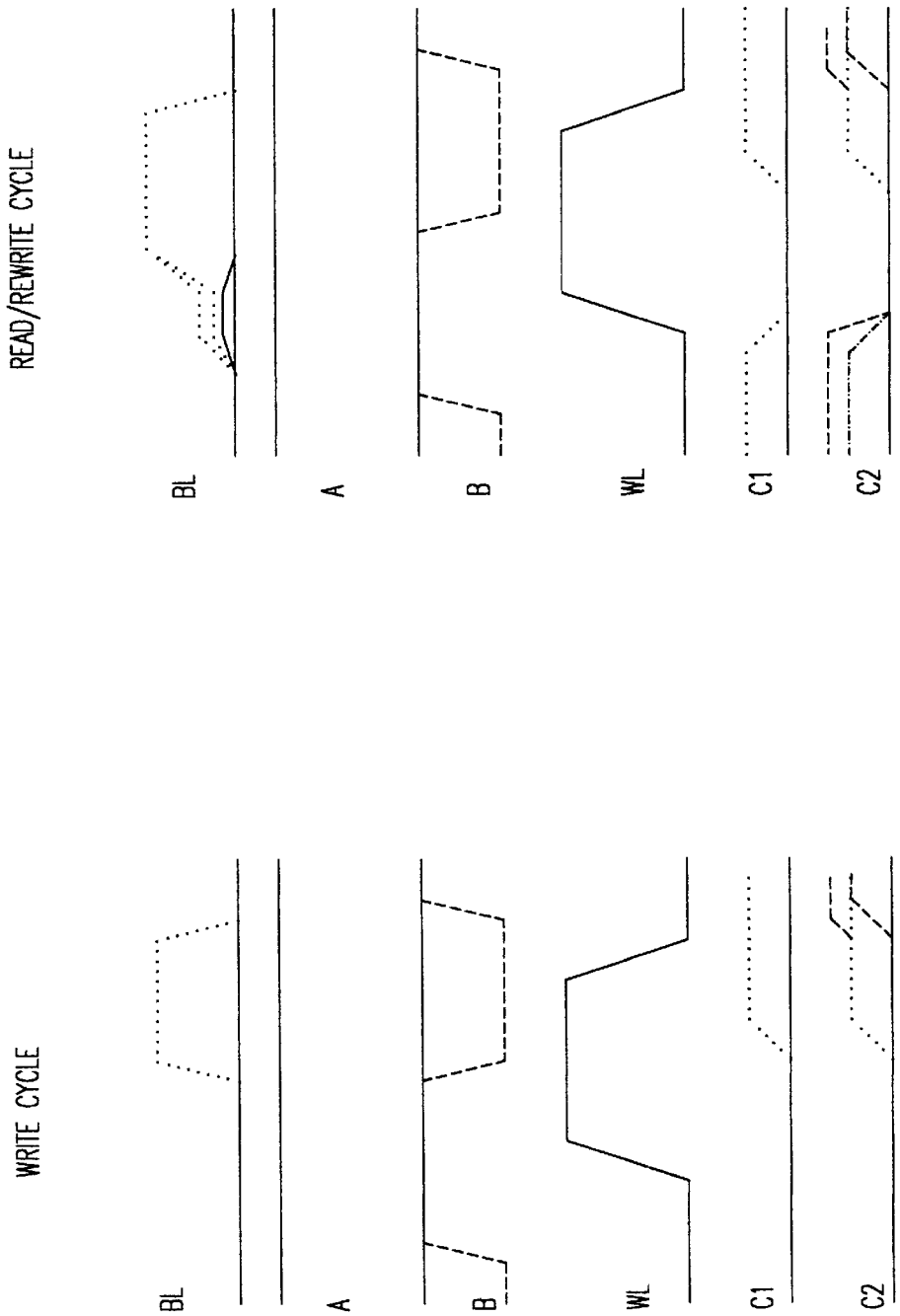

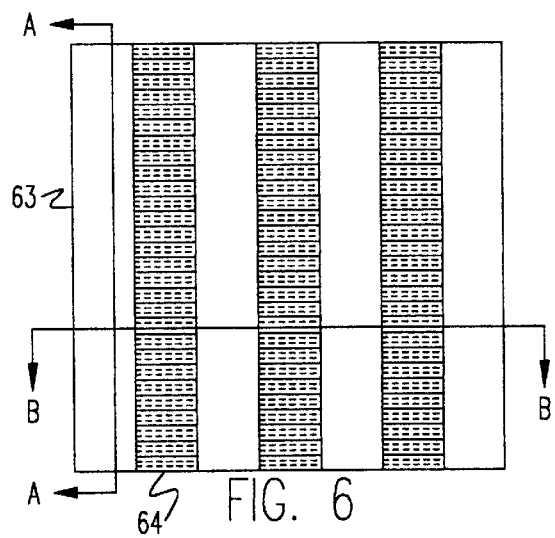
FIG. 6
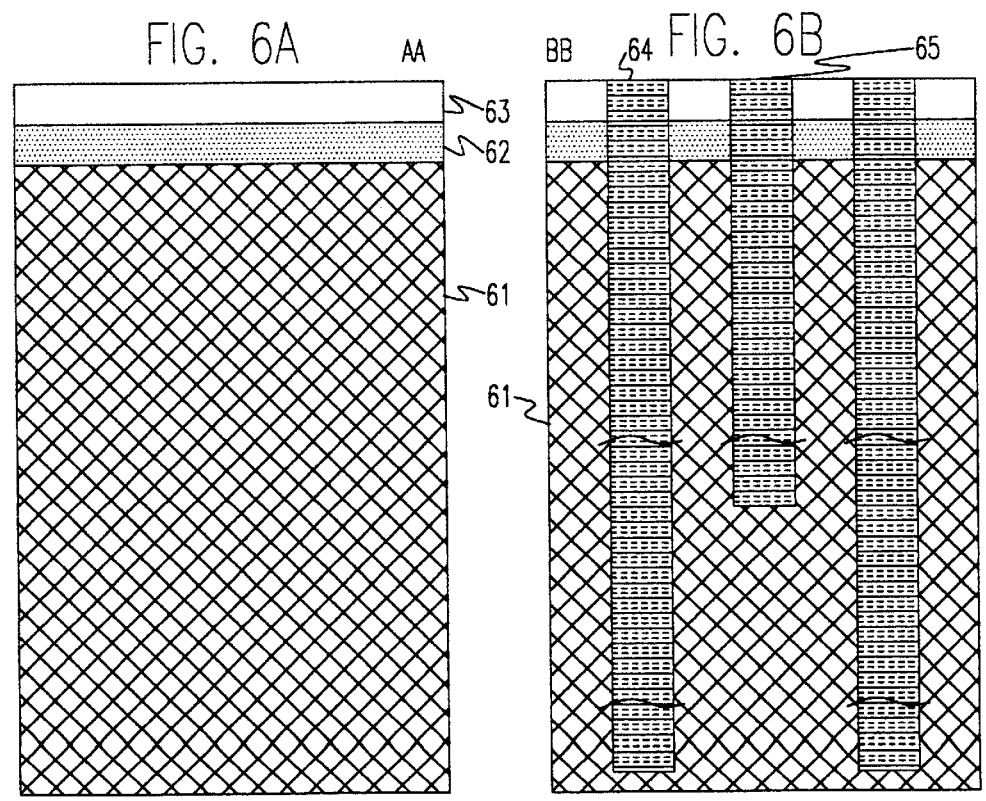
FIG. 6A
FIG. 6B

MULTI-LEVEL DRAM TRENCH STORE UTILIZING TWO CAPACITORS AND TWO PLATES

BACKGROUND OF THE INVENTION

1. Field of the Invention

The present invention generally relates to semiconductor storage structures and, more particularly, to dynamic random access memories of extremely high storage capacity fabricated on chips of limited size.

2. Description of the Prior Art

It is generally recognized that increased integration density in integrated circuits (ICs) provides benefits in both improved performance and manufacturing economy. Increased proximity of devices formed on a chip reduces connection length and capacitance; reducing signal propagation time and increasing noise immunity. Increased noise immunity may, in turn, allow reduction in operating voltages which allows further scaling of devices to smaller sizes on the chip. Increased integration density also allows more devices to be formed on a chip of given size using common wafer processing steps, allowing more chips to be formed with improved uniformity without significant increase of cost. To obtain these benefits, technology has developed at a pace to double integration density about every two years in all types of ICs.

Digital storage devices must generally be used with digital data processors to provide a program of control signals for the processor and data which is to be processed in accordance with the control signals. Increased processing power of processors has also increased the amount of data which the processor may need to rapidly access. At the present state of the art, sixty-four Megabits of storage can be provided on a single chip with acceptable manufacturing yield and these chips, providing many Megabits of storage, are available at relatively low cost on the commercial market.

Increased integration density of memory chips is generally achieved by a combination of improvements in lithography which allow exposure of a resist with sufficient resolution to support smaller minimum feature size regimes and improvements in design; resulting in memory cells which require a smaller number of lithographic squares (an area corresponding to the minimum feature size) in its "footprint". At the current state of the art, feature size regimes of 0.25 micron are reliably producible and the number of lithographic squares required for a binary memory cell is eight.

However, to advance from sixteen Megabit memory chips to the currently available sixty-four Megabit memory chips, little design development was available at the cell level and the increase in capacity was principally developed through reduced feature size regimes and increased chip area. Consequently, some loss in manufacturing economy was encountered in the sixty-four Megabit generation of memory chips due principally to increased overhead of exposure systems capable of higher resolution and reduced number of chips per wafer. Lesser performance gain was achieved than between previous generations of memory chips. While minimum feature size regimes of 0.1 micron and smaller are technically feasible at the present time and foreseeable for commercial production, to develop a further generation of memory chips having a capacity of 256 Megabits per chip or greater without a major improvement in memory cell design would clearly require an unacceptable chip size and economic cost while not fully realizing potential or particularly significant performance improvement.

Accordingly, to provide an improvement in cell design suitable for a further generation of 256 Megabit or greater capacity memory chips, it is generally considered to be necessary to provide a memory cell design that can be fabricated in four lithographic squares. However, to date, no such designs have been developed.

An approach to reducing the number of lithographic squares required for a memory cell below eight, at least functionally, has involved seeking to store different, quantized, voltage levels in a cell. A memory which is operated in such a manner is thus referred to as a multi-level store. In theory, if four states (characterized by different discrete or quantized stored voltage levels) corresponding to the possible combinations of two bits, for example, can be stored in and retrieved from a memory cell having a footprint of eight lithographic squares, only four lithographic squares are effectively required per bit. When such a four-level cell is read, the (approximate) stored voltage level is quantized and decoded by sense latches to provide a digital output which corresponds to two bits. Additional levels may be provided and decoded corresponding to additional bits, depending on the ability to discriminate quantized voltage levels in the presence of noise, stored charge leakage and the like.

However, known multi-level store designs have required all quantized voltages to be supplied to a cell through a corresponding bit line, resulting in substantial drive circuit complexity and requiring substantial chip space to accommodate it (which is thus not available for storage cells). Some performance penalty is also incurred due to the necessary digital-to-analog conversion for writing and to the difficulty of level discrimination (and, possibly, error detection and recovery as the number of stored voltage levels increases). Settling time of both digital-to-analog conversion and analog level discrimination tends to increase with the number of discrete levels utilized. No alternative has been proposed which would allow avoidance of this complexity and performance penalty that would not consume substantial chip space and thus would not permit adequate increase in memory cell numbers to be realized even with a reduction of effective cell footprint or chip area per bit. Similarly, no alternative has been proposed that permits the number of power supplies used for writing the cell to be reduced below the number of bits represented or the number of voltages applied to the cell to be equal to or lower than the number of bits represented. On the contrary, in many proposed multilevel stores, the number of voltage levels which must be produced for application to the bit line may be much larger than the number of bits represented. In other words, no known or proposed cell designs have significantly relieved the tradeoff between storage density and power supply complexity and the chip space necessary to accommodate that complexity.

SUMMARY OF THE INVENTION

It is therefore an object of the present invention to provide a multi-level memory cell which can be fabricated in four lithographic squares and providing storage density of two lithographic squares per bit or less.

It is a another object of the invention to provide a multilevel memory cell which can represent two bits in four quantized voltages using only one voltage supply (providing two logic level voltages) for writing to the cell, thus achieving an effective storage density of two lithographic squares per bit without a requirement for additional voltage source space and with enhanced performance.

It is further object of the invention to provide a multilevel memory cell which can represent three bits in eight quantized voltages using only two voltage sources (providing three voltages) for writing to the cell, thus achieving an effective storage density of one and one-third lithographic squares per bit (exclusive of additional voltage source circuitry).

It is yet another object of the invention to provide a multi-level store cell design which can be fabricated to provide a storage density of two lithographic squares per bit or less and which requires the same or fewer number of voltages than the number of bits represented and fewer voltages than are required for the same number of bits of known designs.

It is a another further object of the invention to provide for integration of multi-level write voltages in a memory cell of a multi-level store.

In order to accomplish these and other objects of the invention, a method of operating a multi-level memory cell having first and second storage capacitor of differing values is provided comprising steps of simultaneously storing a logic level voltage on said first storage capacitor and said second storage capacitor whereby a multi-level signal may be read from said memory cell.

In accordance with another aspect of the invention, a multi-level memory cell is provided comprising two storage capacitors having differing values, two transistors respectively connected in series with a first terminal of each of the storage capacitors and a bit line of said memory cell, and means for applying one of a first logic level voltage and a second logic level voltage to each of the bit line and second terminals of respective ones of the two storage capacitors.

In accordance with a further aspect of the invention, a method of making a multilevel memory having transistors formed of pillars and adjacent plugs separated from the pillars by a gate oxide is provided including steps of forming the pillars, plugs and gate oxide covered by a nitride layer, forming storage capacitors between the pillars, forming a nitride sidewall spacer in a recess above the plugs, forming an oxide cap within the nitride sidewall spacer, and forming openings to the plugs and pillars by respective etching processes which are selective between oxide and nitride.

In accordance with yet another aspect of the invention, a method of making a multilevel memory having transistors formed of pillars and adjacent plugs separated from the pillars by a gate oxide is provided including steps of forming pillars, masking a portion of a lateral side of a pillar, depositing a diffusion source adjacent the pillar, diffusing dopant into an unmasked corner of the pillar, and forming a transistor and a capacitor at respective sides of the pillar connected by a conductive region of the pillar having dopant diffused therein.

In accordance with a further aspect of the invention, a method of making a multilevel memory having transistors formed of pillars and adjacent plugs separated from the pillars by a gate oxide is provided including steps of forming pillars, forming a blind hole at a location between the pillars, lining the blind hole with nitride to form a nitride liner, filling the nitride liner with oxide, recessing the oxide to form a recess, forming a nitride cap in the recess over the oxide, whereby an isolation structure is formed of an oxide fully encapsulated in nitride, and forming transistors and capacitors connected thereto at sides of the pillars and whereby the isolation structure separates two of the transistors.

In accordance with another further aspect of the invention, a method of making a multilevel memory having transistors formed of pillars and adjacent plugs separated from the pillars by a gate oxide is provided including steps of form pillars, diffusing dopant into opposite sides of the pillars from a diffusion source, forming a capacitor dielectric on the side of said pillars extending over the side of the pillars into which dopant has been diffused, isotropically depositing a layer of doped semiconductor material extending over the capacitor dielectric, anisotropically etching the layer of doped semiconductor material to form a capacitor, and forming a transistor connected to the capacitor.

BRIEF DESCRIPTION OF THE DRAWINGS

The foregoing and other objects, aspects and advantages will be better understood from the following detailed description of a preferred embodiment of the invention with reference to the drawings, in which:

FIG. 2A is a truth table explaining the possible stored charge states for writing of the memory cell circuit of FIG. 1 operated as an eight level store, FIG. 2B is a truth table explaining the possible stored charge states for writing of the memory cell circuit of FIG. 1 operated as a four level store, FIG. 2D is a write and read/rewrite timing diagram for the truth table of FIG. 2B, version 2, FIGS. 6A, 7A, 8A, 9A, 10A, 11A, 12A, 13A, 14A and 15A are cross-sectional views along section A—A of FIGS. 6–15, respectively, and FIGS. 6B, 7B, 8B, 9B, 10B, 11B, 12B, 13B, 14B and 15B are cross-sectional views along section B—B of FIGS. 6–15, respectively.

DETAILED DESCRIPTION OF A PREFERRED EMBODIMENT OF THE INVENTION

Figure 1:
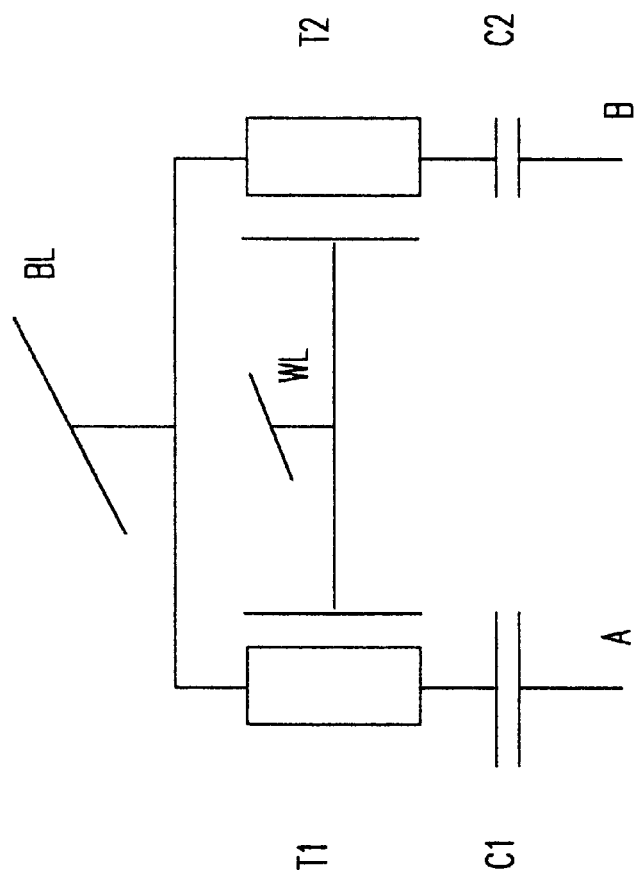
FIG. 1 is a schematic diagram of a memory cell circuit in accordance with the invention.

Referring now to the drawings, and more particularly to FIG. 1, there is shown a schematic diagram of a memory cell in accordance with the invention. The memory cell comprises two capacitors C1 and C2, each having a transistor, T1 and T2, respectively, connected in series therewith between a terminal of each capacitor and a bit line, BL. The transistors are controlled in common by having their gates commonly connected to a word line, WL. The other plate of the respective capacitors C1 and C2 is connected to a respective input A or B.

This latter feature of the invention is a departure from the design of known multi-level stores since known multi-level stores invariably rely on providing multiple voltage levels through the bit line; leading to substantial switching complexity as well as requiring multiple voltage level sources and possibly extended write, read, and cycle times if data is encoded as a combination of voltages on two or more capacitors (which must then be written sequentially). These multiple voltage sources may also be required to compensate for voltage drop across the transistor, further increasing complexity. Provision of two inputs allows at least simultaneous writing to the separate capacitors C1 and C2 and, in combination with other features of the invention, a number of other significant advantages which will be described below and which will become evident to those skilled in the art from the following description.

It should also be appreciated from the foregoing description of the circuit of a single cell in accordance with the invention that the two transistors and the storage of charge in the two capacitors is controlled by the coincidence of signals on a single bit line BL and a single word line WL. Thus, the circuit of FIG. 1 operates as a single memory cell and may be addressed, among a large array of similar cells, in a manner well-known in the art using well-known and simple decoders.

Two other important features of the preferred form of the invention will be described together in the interest of clarity and in order to convey an understanding of the effects of the combination of these features. First, the capacitors of the cell are not equal in value and the values thereof are preferably arranged such that $C2=(\frac{1}{2})\times C1$ (or vice-versa since the identity of C1, arbitrarily depicted as the larger capacitor in FIG. 1, and C2 and their physical implementation in an array is substantially arbitrary).

A different proportioning of the values of C1 and C2 may also be useful with some variant forms of the invention to store multiple (e.g. more than two) voltage levels on either or both capacitors through their respective inputs A and B. The function of integrating the stored voltage level from logic level voltages in the memory cell is provided, in any case, by the mere fact of the difference in value of C1 and C2. However, the above relationship is preferred at the present time since it permits minimization of logic level voltage supply complexity; the second of the two further features as disclosed above.

If, for example, $C2=(\frac{1}{2})\times C1$ (or, alternatively, $C1=2\times C2$) and both are charged to the same voltage during a write cycle and discharged by being separately discharged into the same load (e.g. a sense amplifier or latch), the voltage (or current or charge transfer) seen at the load when C1 is discharged would be twice that seen at the load when C2 is discharged. In other words, for the same voltage stored, the charge stored on capacitor C1 will be twice the amount of charge stored on capacitor C2 and, during a simultaneous read operation of C1 and C2, the contribution of C1 will be twice that of C2 to the electrical parameter (e.g. voltage or current) of interest representing stored data. Therefore, only two logic states represented by one of two logic voltage levels from a single voltage source at each of inputs A and B and only a single voltage at the bit line or input A can produce four different voltages when C1 and C2 are simultaneously read by a multi-level sense amplifier or latch. Provision of only two such logic levels is well-known for writing of conventional binary memories and may be treated, as a matter of design, in the same manner as any digital circuit with attendant high noise immunity.

In the operation of known memory arrays, it is well-known to apply digital data in the form of one of two logic voltages to the bit line BL during write operations. This operation may also be performed in the practice of the present invention in combination with the inputs at terminals A and B to achieve integration and storage of eight levels in the cell, as will be described in greater detail below. In doing so, it should be recognized that an additional logic voltage signal will be necessary but such an additional logic voltage is distinct from a quantized multi-level signal and may be provided with very low noise from a second voltage source referenced to the same voltage (e.g. ground) as the first voltage source. Thus, it is seen that the invention provides for storage with the same or fewer number of voltage levels and one fewer voltage sources than the number of bits represented; a meritorious effect and drive circuit simplification that has not been available from known designs.

It is important to note also that, in the preferred embodiment of FIG. 1 as described above, no digital to analog conversion is required for writing two or three bits of data into the memory cell and logic levels of high noise immunity can be directly applied to the cell as BL, A and B inputs (in descending order of significance: MSB to LSB). Further, only two logic level power supplies, referenced to the same voltage (e.g. zero volts or ground), are needed for the preferred embodiment in order to provide eight levels of multi-level storage in only two storage capacitors of the preferred storage cell.

By the same token, as will be described below with reference to FIG. 2B, only a single logic level power supply (providing two voltages corresponding to two logic states) is required to provide four levels of multi-level storage in the two capacitors of the memory cell in accordance with the invention. While capturing one of the discrete levels of the signal and decoding it into its proper binary value with a latch or several latches may require a longer response time than a conventional single bit sense amplifier, two or three bits are being produced simultaneously and any response time less than two or three times the response time of a conventional sense amplifier represents an improvement in performance over a conventional, single bit per storage cell, arrangement.

This capability of the invention to store eight voltages from three input voltages from two voltage sources and to integrate the input voltages within the cell in a single, simultaneous, write operation can be particularly appreciated from, for example, the second and third lines of the truth table of FIG. 2A. Although the same logic voltage is applied to bits A and B for the respective input codes (BL, A, B) of 010 (second line) and 001 (third line), that single applied voltage results in read out charge levels that differ by 0.5 (e.g. referred to the charge on capacitor C1). Similar effects can be seen for other adjacent pairs of lines that differ by a value corresponding to a change of state of the least significant bit, B.

Addressing can be accomplished with simple and well-understood decoders and address selectors providing either of two logic states on the word line WL and one of two logic states on the bit line BL. Therefore the memory cells can be efficiently arranged in a matrix array and accessed over connections that may be readily formed by known, high-yield processes. Further, the symmetry of the respective cell circuits allow physical implementation consistent with a small footprint of only four lithographic squares (allowing a storage density of two lithographiic squares or fewer per bit). Such an implementation is not compromised by the asymmetry of the different values of capacitors C1 and C2 as will now be discussed in connection with FIGS. 3–5.

As alluded to above, while the storage cell of FIG. 1 can be operated as an eight level multi-level storage cell effectively requiring only one and one-third lithographic squares per bit, it may be advantageous for some applications to operate the storage cell of the invention as a four level multi-level store. A truth table with two versions for a four level mode of operation is shown in FIG. 2B, which, for clarity, will be described prior to discussion of an eight-level mode of operation of the same structure. In version 1, it will be appreciated that the column for the bit line BL input is a single voltage (e.g. zero volts) and will always be applied to the bit line during writing. In version 2, Input A is a single voltage (e.g. 1 volt) that is always applied to input A during writing.

Operation of the memory cell of FIG. 1 as a four level store effectively requires two lithographic squares per bit. This storage density is comparable to the increase in storage density of a known eight lithographic square cell operated as an eight level store as compared to known binary memory cell designs. While a further increase in storage density is available with the cell in accordance with the invention operated as an eight level cell, as will be described below, only a single logic level supply (providing two logic voltage levels) is required. This simplification of voltage supply increases the proportion of the chip space on which memory cells can be formed. Further, the settling time of voltages during write and read operations is reduced in the four level mode of operation and thus write and read operations can be performed more rapidly.

In the case of operation of the memory cell of FIG. 1 as a four level store, a single voltage is applied to either the bit line (version 1) or input A (version 2) as shown in the truth tables of FIG. 2B. In either case, the application of one of two logic level voltages (derived from a single power supply) to input B and input A (version 1) or bit line BL (version 2) causes the differently sized capacitors to be simultaneously discharged to one logic level voltage and/or charged to the other logic level voltage as the cell is written. Upon simultaneous readout of the charge stored on the capacitors, one of four discrete levels (differing by 0.5, as shown in the "data" column) will be produced as data which may then be converted to a combination of two digital bits.

In the case of operation as an eight level store, it is preferred, for simplicity of explanation as well as implementation, to choose the voltage representing one of the logic states (e.g. "0") at the bit line input to be the same as that applied to inputs A and B and to choose the voltage representing the other logic state (e.g. "1") to be twice the voltage of the corresponding logic state voltage applied to inputs A and B. (The invention could be practiced with any voltage representing logic "1" other than that representing logic "1" applied to the A input to avoid an ambiguity upon readout. No ambiguity will result between input B and either input A or the voltage applied to the bit line because of the difference in values of C1 and C2.)

Referring now to the truth table of FIG. 2A, if exemplary logic voltages of 0 or 2 volts for the bit line BL and 0 or 1 volt for inputs A and B are applied to the cell as shown in columns BL, A and B, the data, upon readout, will assume one of eight discrete charge levels (or a voltage which can be quantized into one of eight levels by the sense amplifiers or latches). These discrete levels can be readily decoded into three binary bits with a simple discrimination circuit or analog-to-digital converter; the details of which are unimportant to the practice of the invention.

Figure 2C:
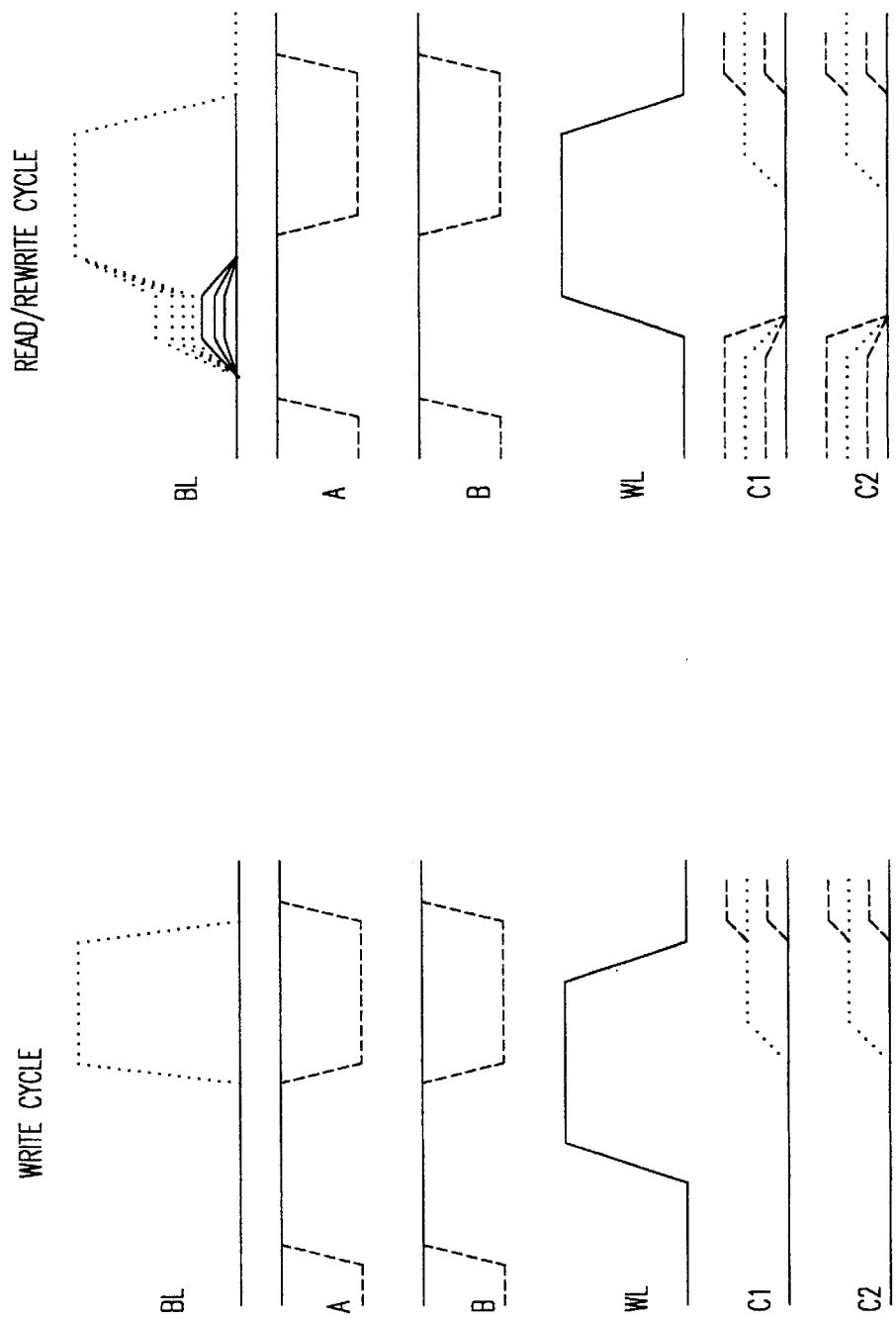
FIG. 2C is a write and read/rewrite timing diagram for the truth table of FIG. 2A.

FIGS. 2C and 2D show one exemplary set of timing diagrams for the eight level version of FIG. 2A and for the four level version 2 of FIG. 2B, respectively. These timing charts are a composite of the possible combinations of voltages that the various signal lines can possess for the shown examples. The timing FIGS. 2C and 2D show the bit line restored to "0" level and inputs A and B restored to the "1" level. The word line is then activated and the charge stored in capacitors C1 and C2 is transferred to the bit line where it is captured for sensing and decoding into the proper binary value. This binary value is used to set the bit line BL and the inputs A and B to their proper values as shown in FIGS. 2A or 2B. The word line is then deactivated capturing the charge on capacitors C1 and C2. The inputs A and B and the bit line BL are then restored back to their appropriate values of "1" and "0". This process may be performed for either a read and rewrite operation or to refresh the cell.

Figure 3A:
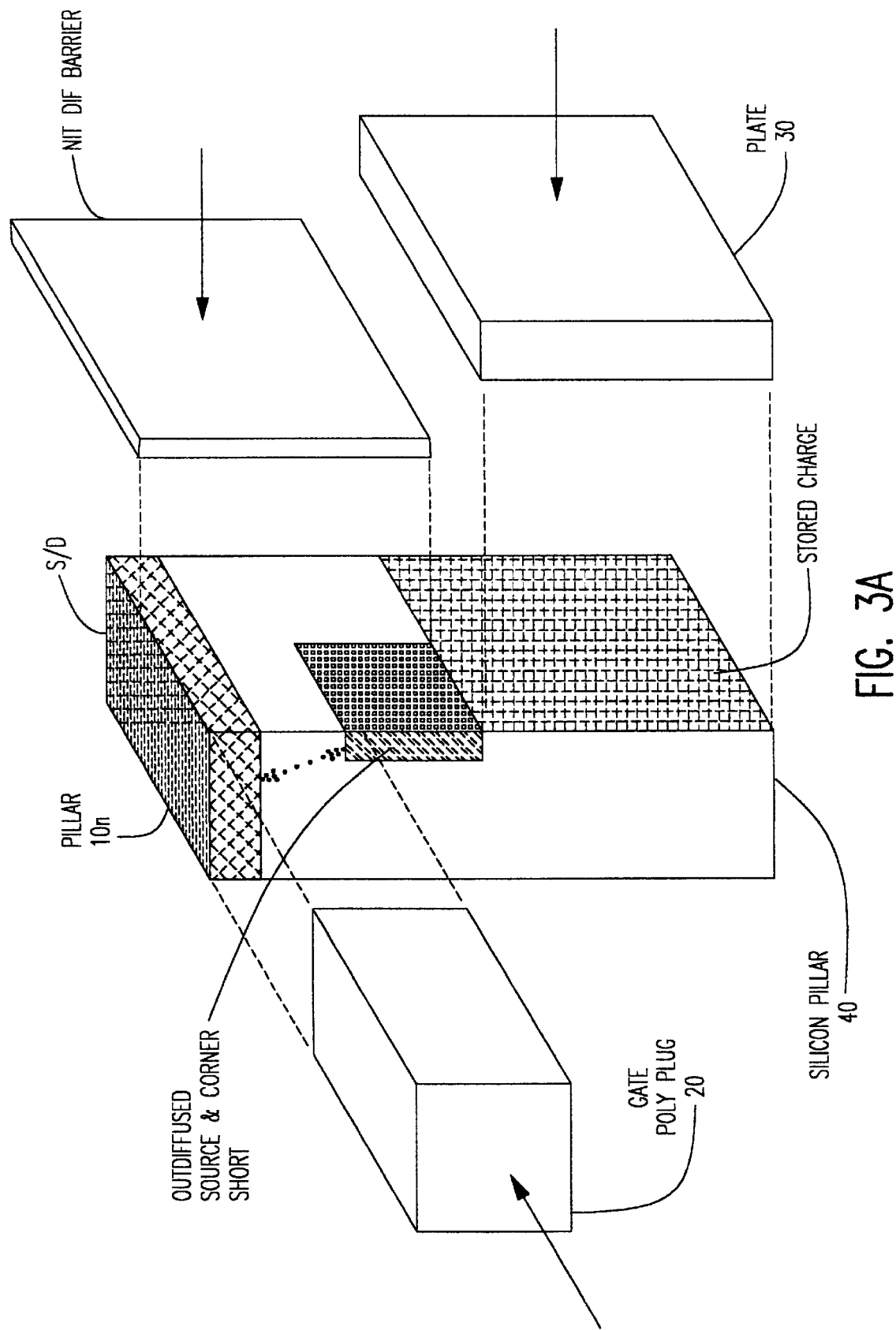
FIGS. 3A and 3B are perspective, exploded views of a preferred form of the memory cell of FIG. 1, FIGS. 4 and 5 are plan (also referred to as "top-down" or "layout") views of two practical embodiments of a multi-level memory including the memory cell of FIG. 3, FIGS. 6, 7, 8, 9, 10, 11, 12, 13, 14 and 15 are plan views illustrating fabrication of a multi-level memory in accordance with the invention.
Figure 3B:
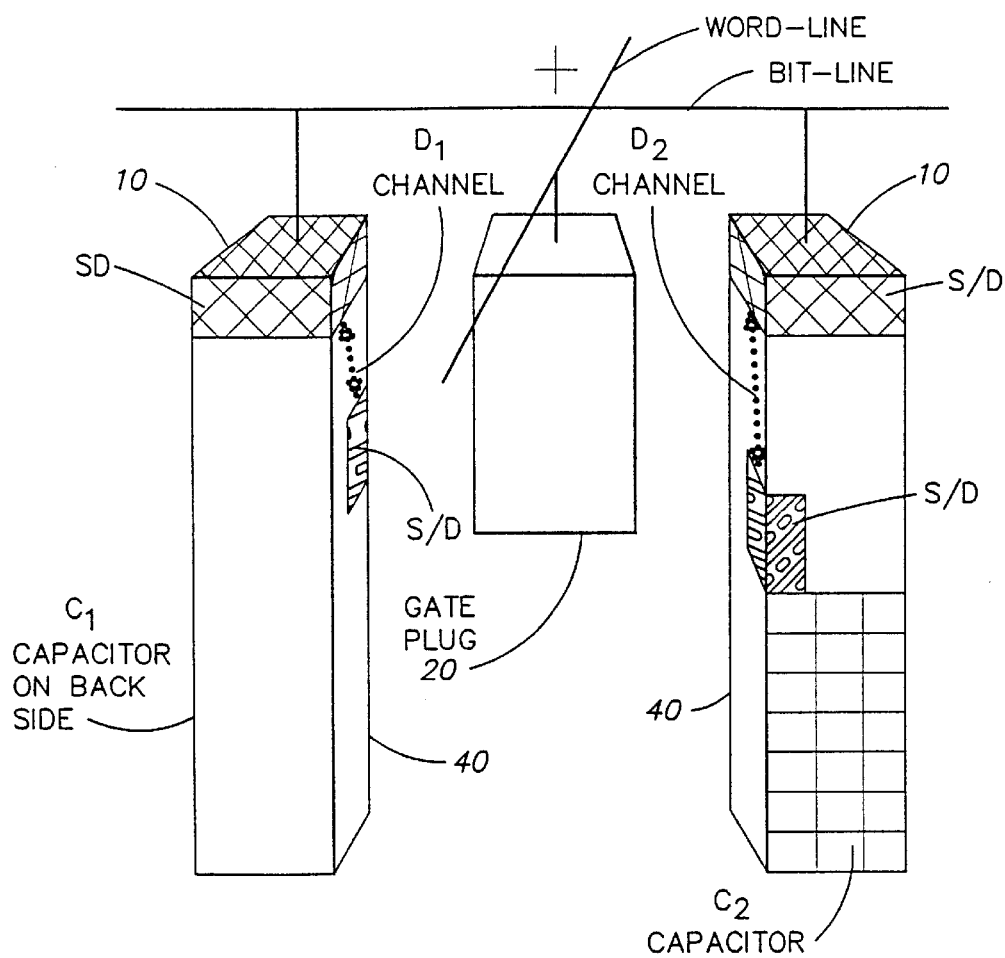

FIGS. 3A and 3B are exploded perspective views of a preferred physical implementation of a memory cell in accordance with the invention and which permit the memory cell of FIG. 1 to be fabricated in four lithographic squares. More specifically, FIG. 3A is arranged to show a portion of a memory cell to more fully illustrate the formation of major elements thereof while FIG. 3B substantially illustrates a complete cell although it should be understood that portions of adjacent cells are necessarily included because of the preferred layout which provides minimum chip area for each cell.

As a general overview of the preferred cell structure, a portion of which is shown in FIG. 3A, conduction channels of transistors are formed vertically in sides of silicon pillars 10 which are controlled by gates formed of silicon plugs 20. The surface of silicon pillar 10 also forms one plate of a capacitor which faces a second (common) capacitor plate 30. In order to conveniently form the second capacitor plate(s), a corner diffusion forms a connection 40 at a corner of the silicon pillar 10 so that the transistor and capacitor can be placed on adjacent sides of the silicon pillar and connected in series thereby. These corner connections 40 are placed on diagonally opposed corners of each silicon pillar 10 and the other corners provide corner isolation between cells.

As more particularly shown in FIG. 3B, two silicon pillars 10 are used for each memory cell but each silicon pillar 10 also accommodates a transistor and capacitor plate of an adjacent cell as well. A single silicon plug 20 thus provides a gate connection between the gates of transistors formed on facing surfaces of adjacent silicon pillars 10. In the view of FIG. 3B, capacitor C2 of the cell corresponding to silicon plug 20 will be formed on the front side of the silicon pillar on the right, and capacitor C1 will be formed on the back side of the silicon pillar 10 on the left.

By the same token, the front side of the silicon pillar 10 on the left will be used to form the C2 capacitor for the next adjacent memory cell to the left and the back side of the silicon pillar 10 on the right will be used to form the C1 capacitor for the next adjacent memory cell to the right of the memory cell illustrated. These additional capacitors will be controlled by other silicon plugs 20 connected to adjacent word lines.

It should be noted that this configuration allows all of the silicon pillars in a row (or column) in the plane of the page of FIG. 3B to be connected to a single bit line at the top surface of each silicon pillar 10 which will form a source/drain of the transistors formed on opposite sides thereof and controlled by respective gates formed by respective silicon plugs 20. It should also be noted that all of the C1 capacitors are formed on a common (e.g. back) side of the silicon pillars 10 and all of the C2 capacitors are formed on a common, opposite (e.g. front) side of silicon pillars 10. This commonality of location of capacitors which are of a common value which differs from the common value of capacitors in another common location also facilitates fabrication of the preferred form of the memory cell in accordance with the invention in a manner which will now be discussed in connection with FIGS. 4 and 5 which are plan views of two exemplary embodiments of invention.

Essentially, the storage capacitors of the memory cells are formed in trenches or troughs 50, 51 between the rows of alternating silicon pillars 10 and silicon plugs 20. The values of the capacitors are determined by the geometry of the lateral side of the silicon pillars facing the trench and opposed by common capacitor plate 30. As indicated above, it is preferred that the values of storage capacitors C1 and C2 be in a ratio of 2:1. Thus the area of the capacitor plates is established by pillar width and trench depth and either or both of these dimensions can be adjusted for respective trenches and/or rows (as depicted in FIGS. 4 and 5) of silicon pillars 10 to achieve the desired ratio of capacitance values for C1 and C2 capacitors of respective memory cells.

Figure 4:
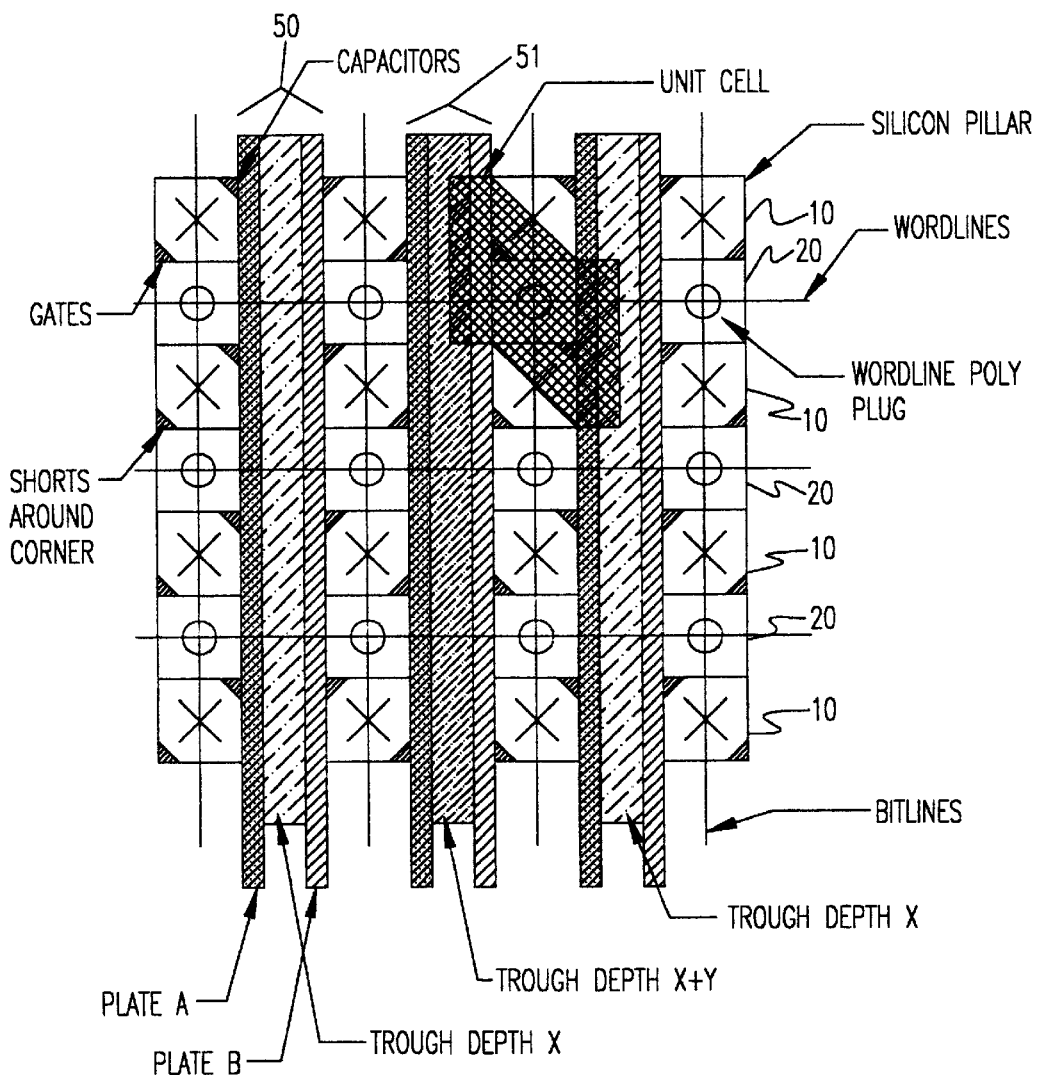
Figure 5:
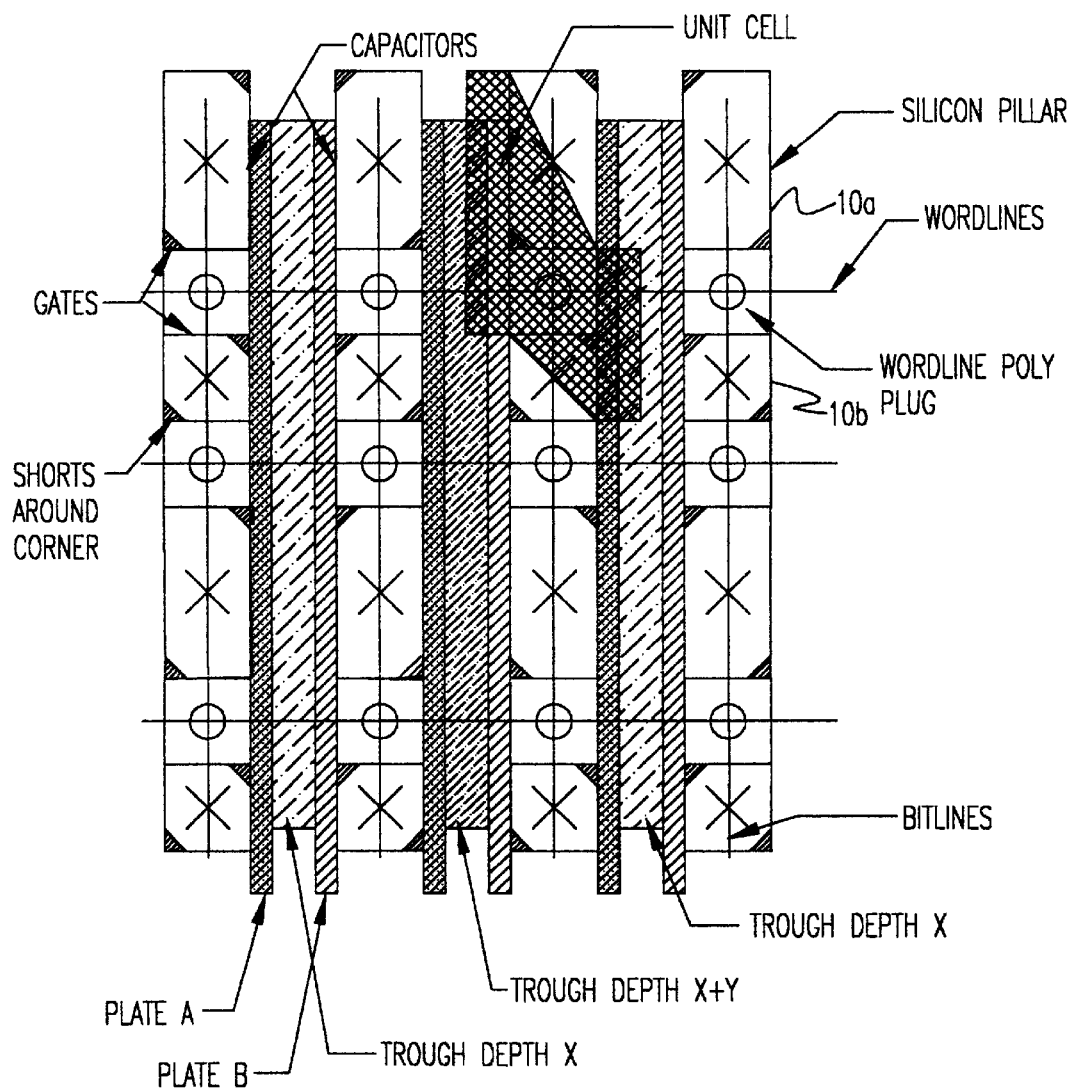

Specifically, in FIG. 4, showing a plan view of a representative portion of the memory structure in accordance with the invention, all of the silicon pillars 10 are of like dimensions but the trenches 50 and 51 are of different depth to provide capacitors of greater value in trench 51 than are formed in trench 50. Alternatively, in FIG. 5, alternating silicon pillars 10a and 10b have different widths of the respective sides facing trenches and the ratio of capacitance values for C1 and C2 can be achieved with trenches of a single depth. The respective areas of exemplary unit cells are hatched in FIGS. 4 and 5 and it can be seen that the unit cell area in FIG. 5 is about 25% larger than the unit cell area of FIG. 4 for the same minimum feature size.

Nevertheless, it should be appreciated that the processes required to from trenches of only a single depth are somewhat simpler and substantially less critical than if trenches of two depths were to be used. Therefore, it is possible in some implementations of the invention that smaller feature sizes could be employed for the variation of FIG. 5 than in the variation of FIG. 4 for comparable manufacturing yields to yield substantially equal unit cell areas for either exemplary variation.

In the following discussion of an exemplary process for fabrication of a memory device in accordance with the principles of the invention and a preferred embodiment thereof, the exemplary variation of FIG. 4 will be employed since the difference in trough or trench depth will then be visible in the cross-sectional views and thus better convey an understanding of the process in accordance with the invention as well as the structure of the memory array, itself. As indicated above, the embodiment of FIG. 5 differs from that of FIG. 4 in the geometry of the silicon pillars 10 and utilizing only a single trench depth. Therefore the process for making the embodiment of FIG. 4 will be fully enabling for the embodiment of FIG. 5. Each of FIGS. 6–15 are plan views of various stages of fabrication of the memory device and FIGS. 6A–15A and 6B–15B are corresponding sectional views along sections shown in the respective plan views and which are consistent among respective groups of these Figures. This numbering convention will be used throughout these Figures.

Referring to FIGS. 6, 6A and 6B a silicon substrate 61 having a diffusion layer 62 which will form a source/drain region of the transistors and a pad nitride layer (as a polish stop) 63 on a surface thereof is provided. A lithographic resist is then applied and exposed with a deep trench (DT) storage trough mask which preferably comprises stripes of approximately equal width and spacing and preferably of the minimum feature size. Upon development of the resist, the substrate troughs or trenches 64, 65 are etched. To provide two depths of trenches, two masking steps would generally be used; patterning all trenches 64 and performing a partial etch and then covering alternate trenches 65 and etching to the final depth. The trenches are then preferably filled with germanium oxide or other material which will provide selectivity of etching relative to silicon and the surface is planarized back to the pad nitride by any convenient process such as polishing.

Figure 7:
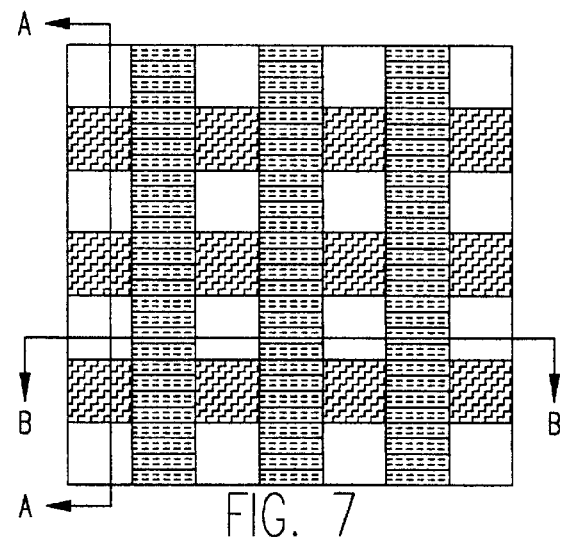
Figure 7A:
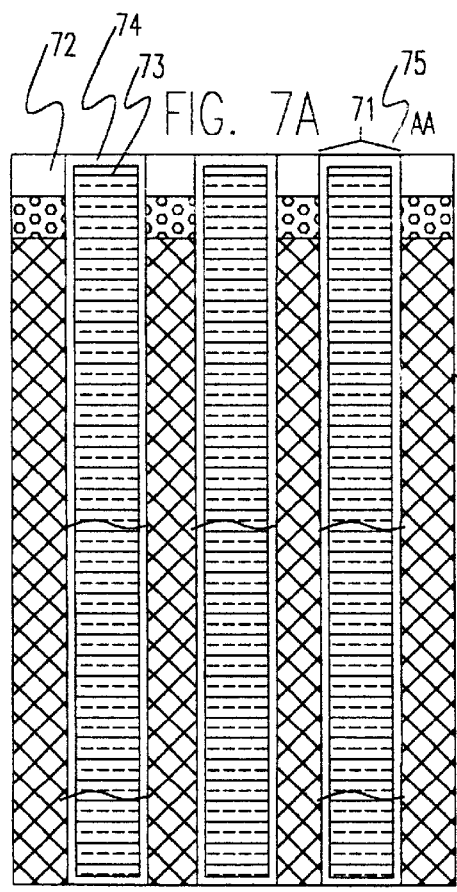
Figure 7B:
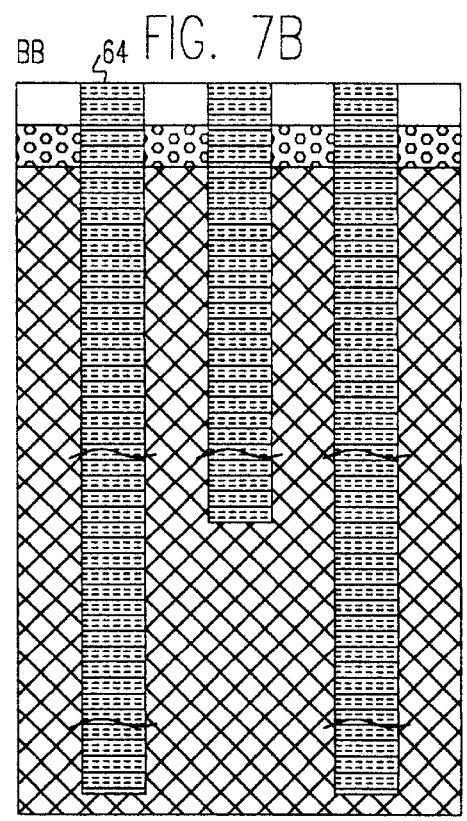

Referring now to FIGS. 7 (which appears the same as FIG. 6 in plan view because of the isolation structure having a nitride surface being formed), 7A and 7B (which appears the same as FIG. 6B since the processes do not affect the section shown) the process continues by application and patterning of a further resist in accordance with an isolation mask preferably in the form of stripes with substantially equal width and spacing and oriented orthogonally to the patterning of FIG. 6. The silicon is then anisotropically etched selectively to the fill of trenches 64, 65 (e.g. germanium oxide).

This selective etch thus provides a plurality of rectangular blind holes 71 in the substrate 61 to a depth at least equal to the depth of the deeper trenches 64. A nitride isolation liner 72 is then deposited within the holes 71 and the holes are then filled with oxide which is than planarized to the surface of pad structure 63 (preferably a nitride layer over a thin oxide layer to reduce stresses due to difference in coefficients of thermal expansion). The oxide fill 73 is then briefly etched (preferably selectively to the nitride) to slightly recess the fill and a nitride layer is deposited and planarized to form caps 74. The resulting structure thus forms isolation structures 75 fully encased or encapsulated in nitride and filled with oxide interposed between locations of silicon pillars 76.

Figure 8:
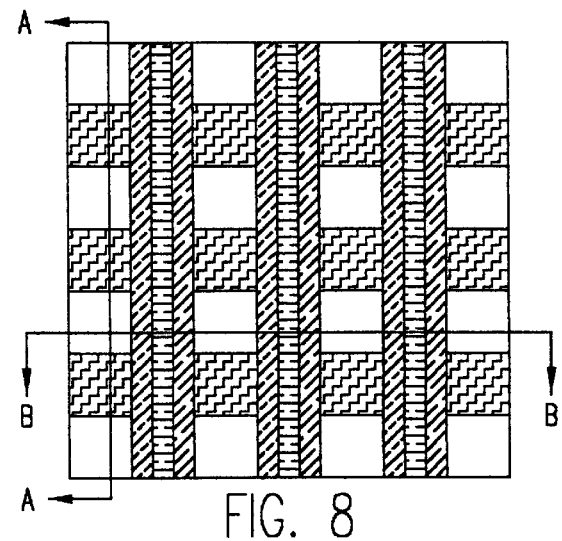
Figure 8A:
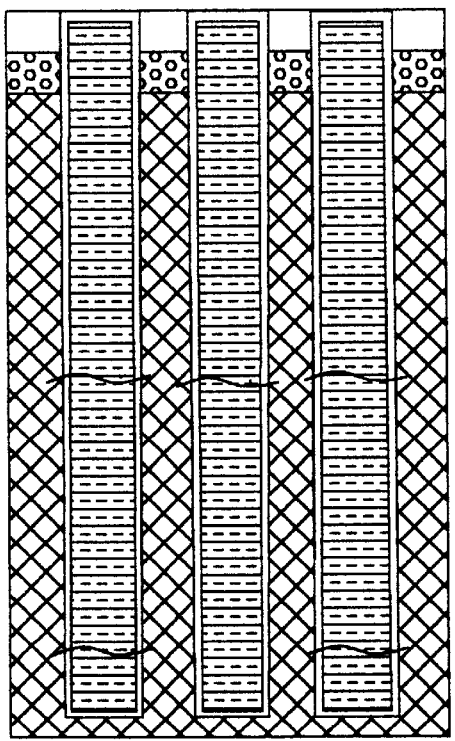
Figure 8B:
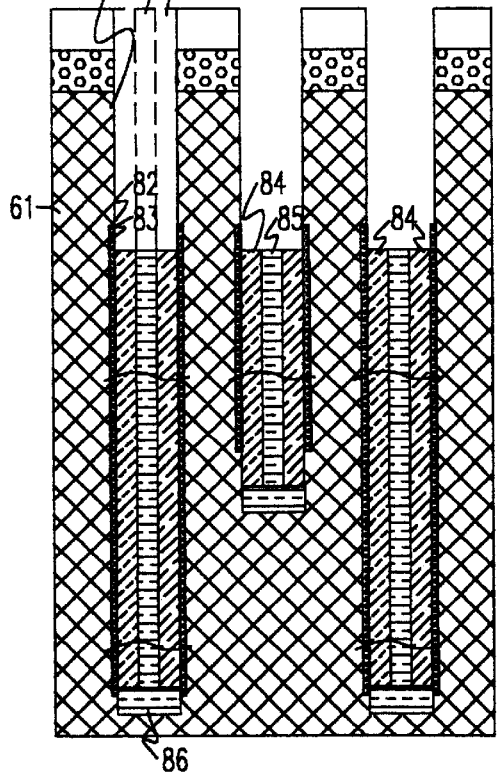

Referring now to FIGS. 8, 8A and 8B, the formation of the capacitors will now be described. As particularly shown in FIG. 8B, the fill (e.g. germanium oxide) of trenches 64 and 65 is removed by etching selectively to silicon and silicon nitride and the bottoms of the trenches are oxidized to form bottom isolation 86 below the capacitors which will be formed. A dopant source film (or fill) such as arsenic doped glass (ASG) is then deposited on walls 81 of the trenches and then recessed by selective etching (preferably by filling with an organic material, recessing the organic material with an oxygen plasma and wet etching the dopant film) to the desired depth of the common capacitor plates (indicated at 82). The structure is then heat treated in a manner well-understood in the art to diffuse dopant from the dopant source film into the surface 83 of the trench walls to form capacitor plates. The dopant source film can then be removed by selective etching.

The storage node dielectric 84 is then formed, preferably by oxidizing and/or nitridizing of the surface of the silicon walls of the trenches. Polysilicon is then deposited over the storage node dielectric 84 to form sidewalls 87 (much in the nature of forming sidewall spacers on field effect transistor gates) by conformal coating and isotropically etching horizontal surfaces at the top and bottom of the trench. At this point, polysilicon now surrounds the combination of isolation and silicon pillars. Lithographic patterning and an isotropic is used to separate the polysilicon layer into discrete plates. Thickness of the sidewalls is not critical to the practice of the invention. The region between the sidewalls is then filled with silicon dioxide 88 and planarized. This fill 88 is then recessed to the desired depth of the capacitor plates 85 to provide a mask for an isotropic etch of the conformal polysilicon layer 87 to the surface of the silicon oxide to form capacitor plates 85 at the desired capacitor depth with an insulator 86 therebetween.

It should be appreciated that other techniques for forming the sidewalls and insulation layer between them could be used except for the fact that the trench width is preferably formed at the minimum lithographic feature size. The process of conformal coating and anisotropic etch or a similar self-aligned process is necessary to form these features at sub-lithographic size.

Figure 9:
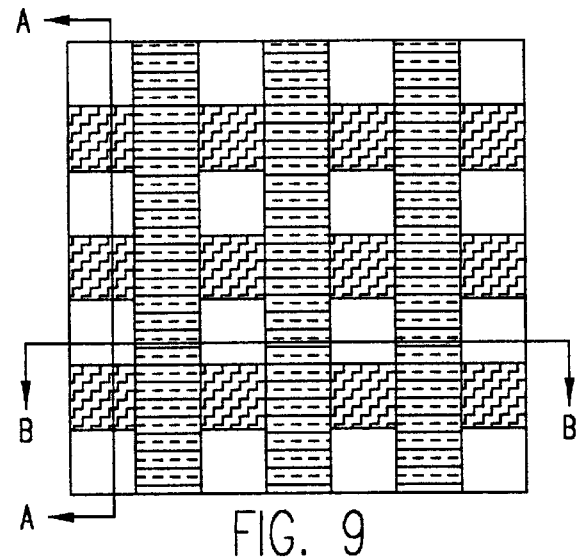
Figure 9A:
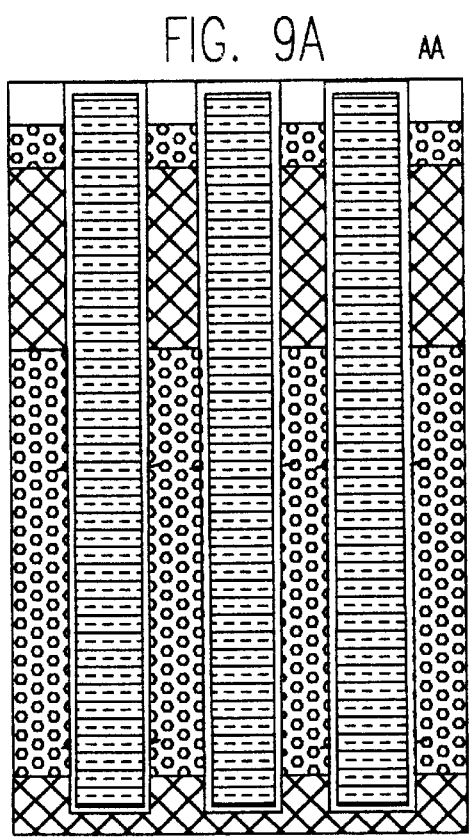
Figure 9B:
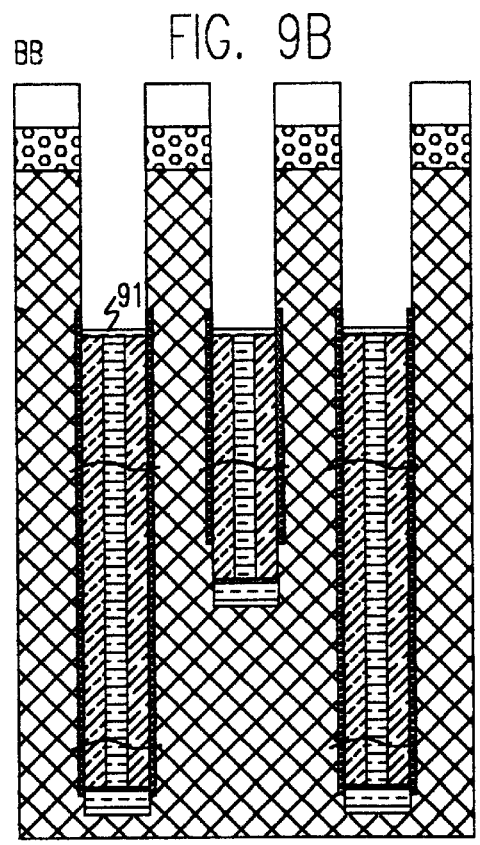

FIGS. 9, 9A and 9B show the formation of a storage capacitor top oxide 91 to complete isolation of the capacitor plates within the trench from the transfer gate plug which will be placed thereover as well as providing a diffusion barrier during formation thereof. The method of forming oxide layer 91 is not critical to the practice of the invention. The thickness of the layer is preferably kept to a minimum as long as isolation and a diffusion barrier are achieved.

Figure 10:
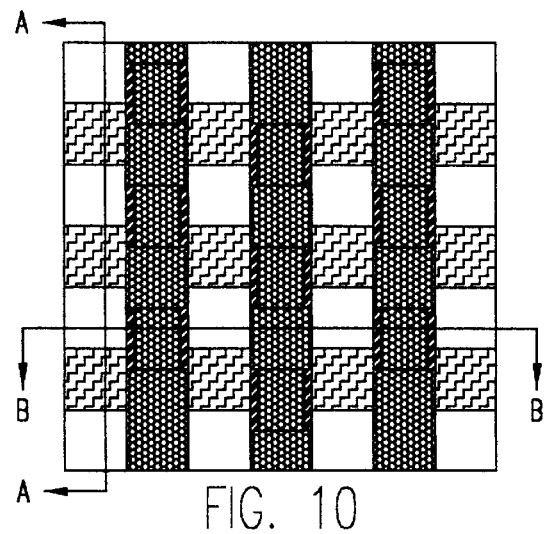
Figure 10A:
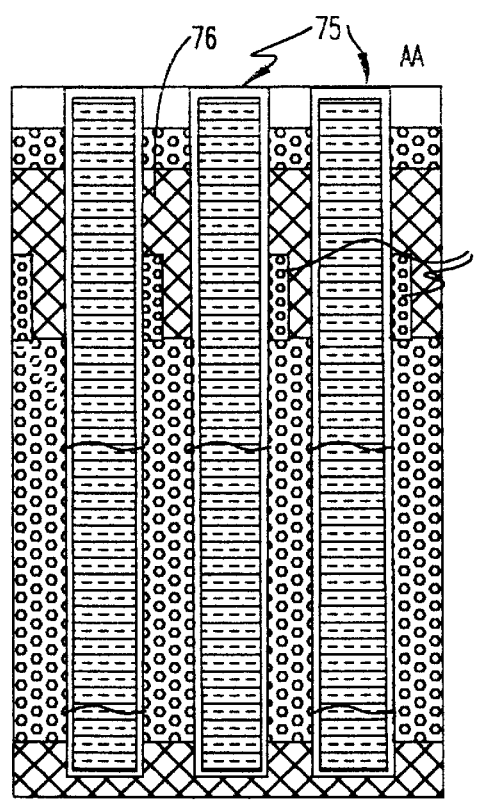
Figure 10B:
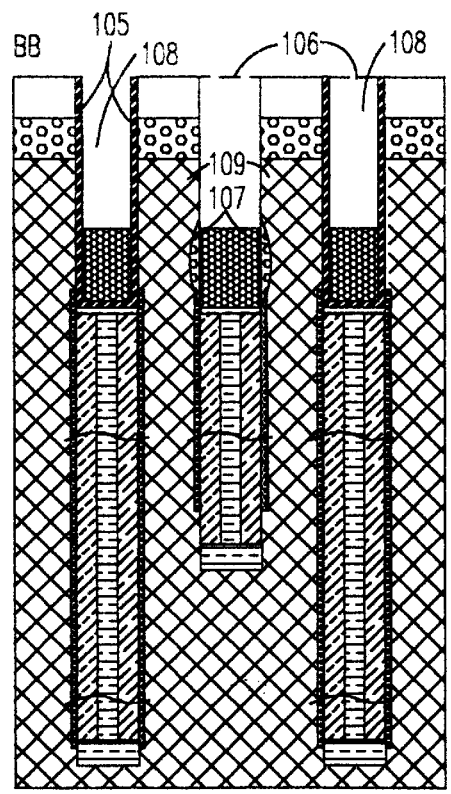

Referring now to FIGS. 10, 10A and 10B, the formation of the corner conductors 40 (FIGS. 3A and 3B) will now be discussed. First, a conformal layer of nitride 104 is deposited on all exposed surfaces including interior surfaces of the portions of the trenches above the oxide. A resist is applied and patterned with a corner mask of squares at the minimum feature size and which is displaced from the patterning of the isolation mask discussed above in connection with FIG. 7, preferably by one-half of the minimum feature size.

The nitride is then isotropically etched to remove the nitride in alternating regions of each trench along the section BB which overlap a portion of the isolation structures 75 as well as portions of the silicon pillars 76. A diffusion source of doped polysilicon is then deposited as indicated by dashed lines 106 and the structure is heat treated to diffuse dopants from the polysilicon into corners of the polysilicon at 107 to thus form the corner conductors 40, described above. It should be noted that diffusion only occurs at alternating corners of trenches along a particular section and thus forms corner diffusions which alternate in direction (from silicon pillar to silicon pillar) diagonally across respective ones of the silicon pillars 76. That is, diffusions similar to 107 will also be formed in the same silicon pillars 109 and other silicon pillars in front of and behind the plane of the page of FIG. 10B from diffusion sources 106 in trenches 108, as can be seen in FIG. 10A.

Figure 11:
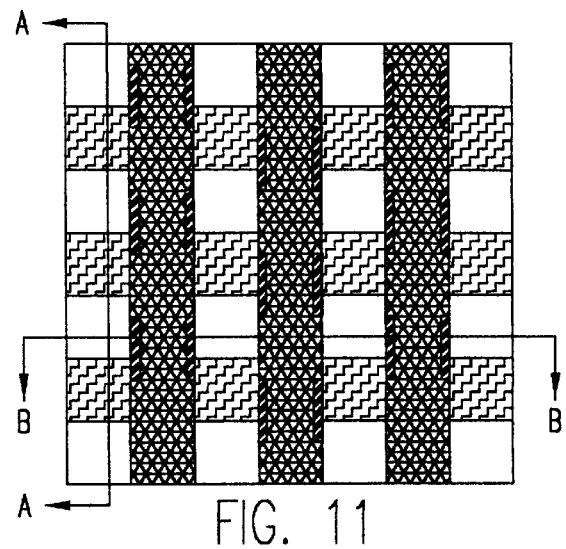
Figure 11A:
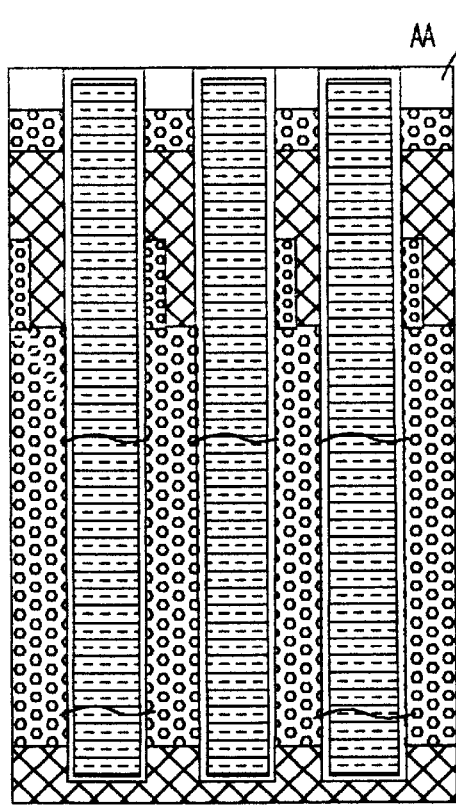
Figure 11B:
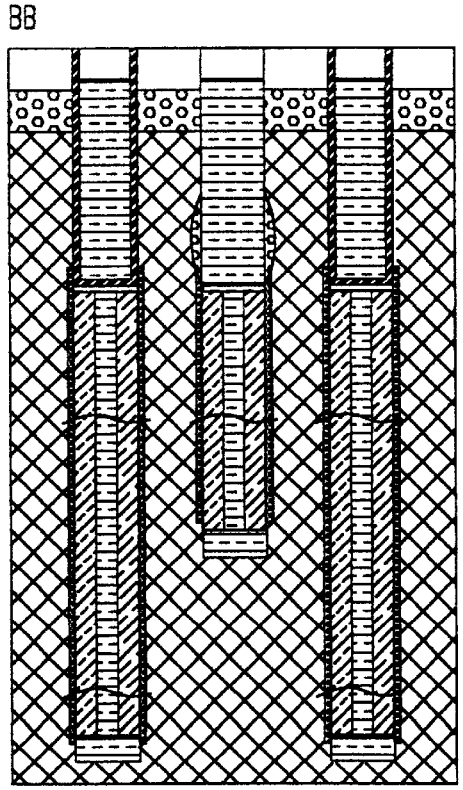

Referring now to FIGS. 11, 11A and 11B, the doped polysilicon diffusion source is etched away and the trenches filled with silicon dioxide which is then planarized to the surface of the pad nitride 63. The silicon oxide is then recessed and capped with nitride which is then also planarized.

Figure 12:
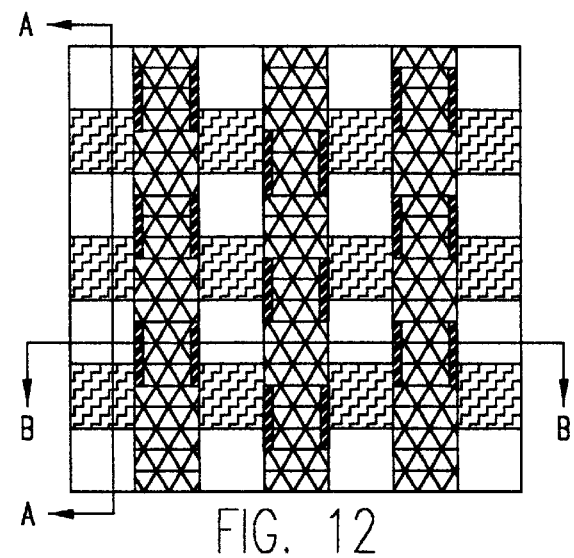
Figure 12A:
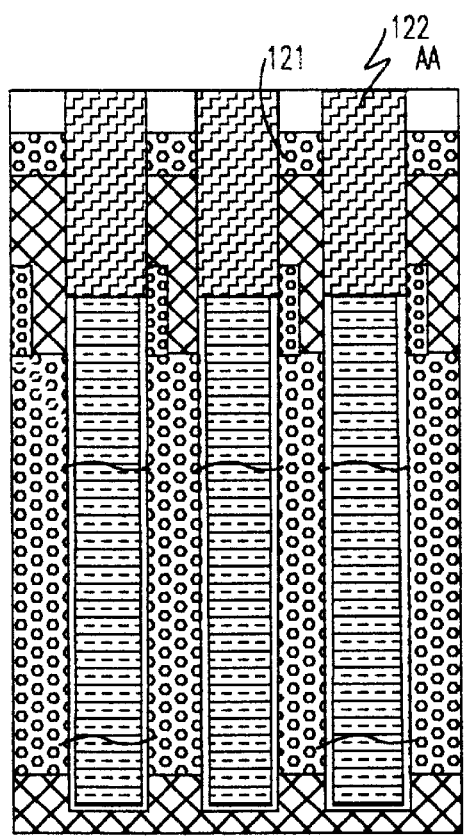
Figure 12B:
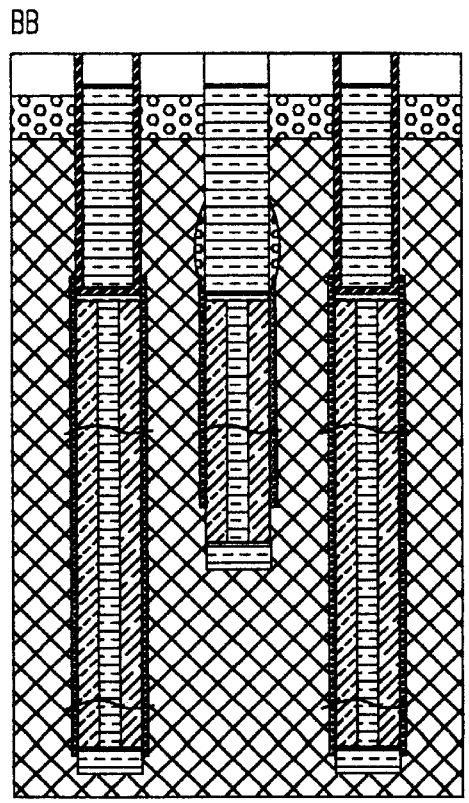
Figure 13:
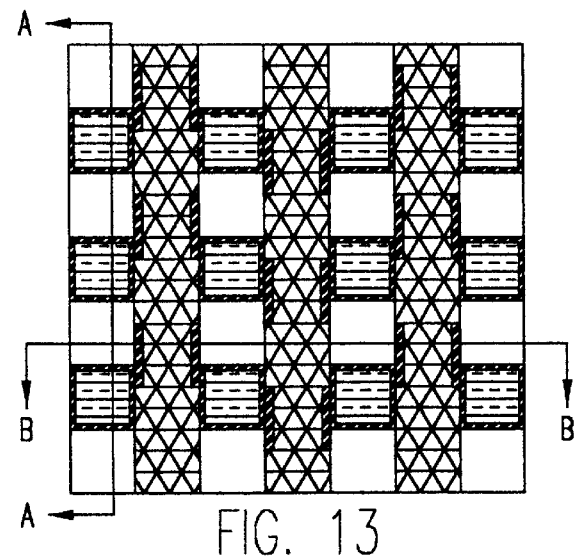
Figure 13A:
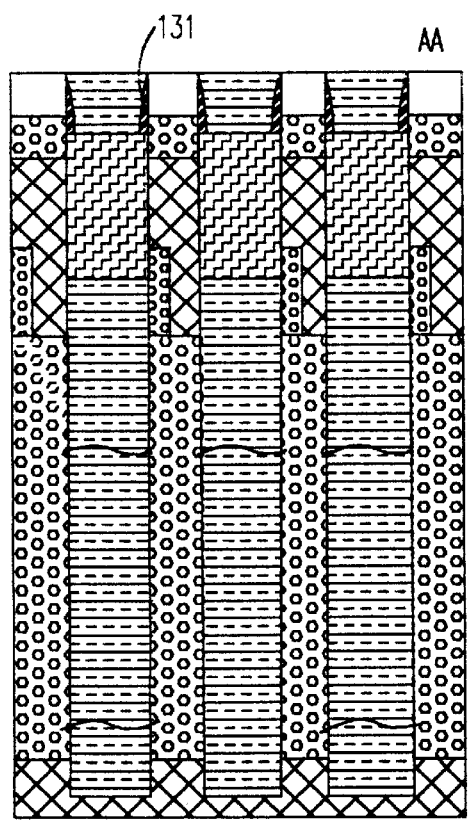
Figure 13B:
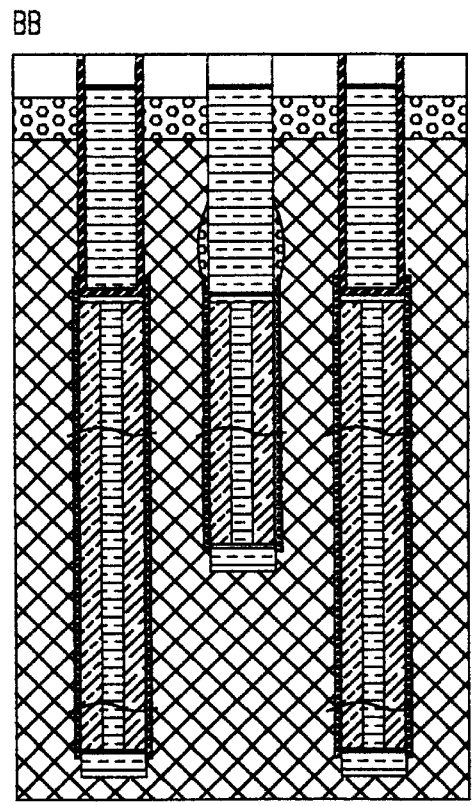

Then, as shown in FIGS. 12, 12A and 12B, the upper portions of the isolation structures 75 are oxidized to form a sacrificial oxide (preferably by heat treatment in an oxygen atmosphere) which can then be stripped, leaving blind holes above the remaining isolation structure. The surface so exposed is oxidized to form a thin gate oxide 121 for the transistors which will control storage in the memory cell. The blind holes are then filled by depositing a doped polysilicon layer which is then planarized into plugs 122. The polysilicon plugs are then recessed below the surface of the nitride pad layer 63 and nitride sidewall spacers formed therein. The remainder of the volume of the recess is then filled by deposition of a layer of silicon dioxide which is then planarized, as shown in FIGS. 13, 13A and 13B. The nitride sidewalls and oxide fill allow the formation of borderless contacts which will now be discussed in connection with FIGS. 14 and 15.

Figure 14:
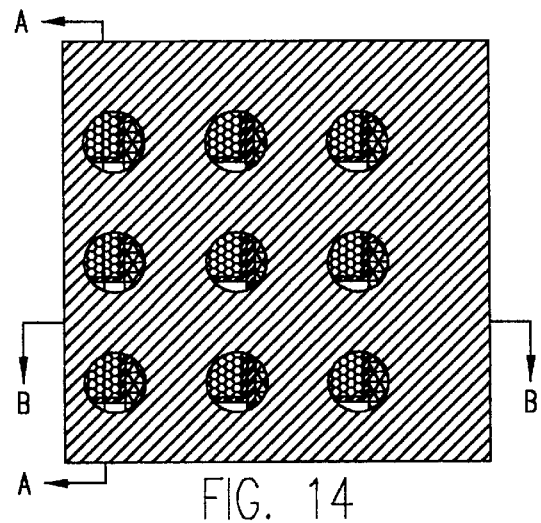
Figure 14A:
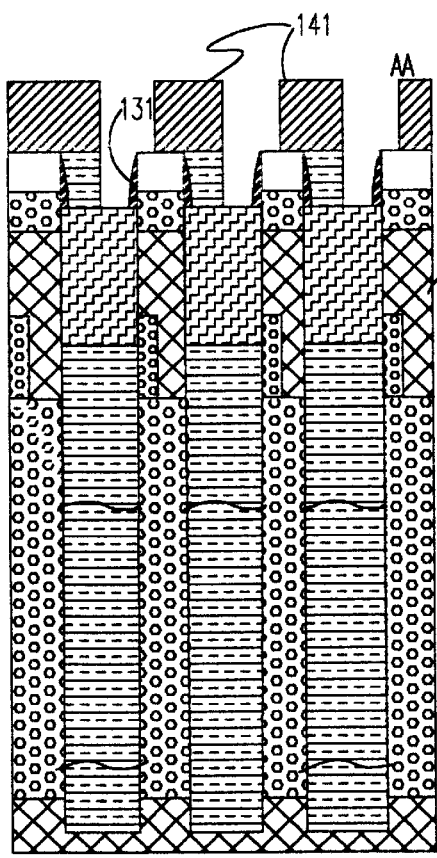
Figure 14B:
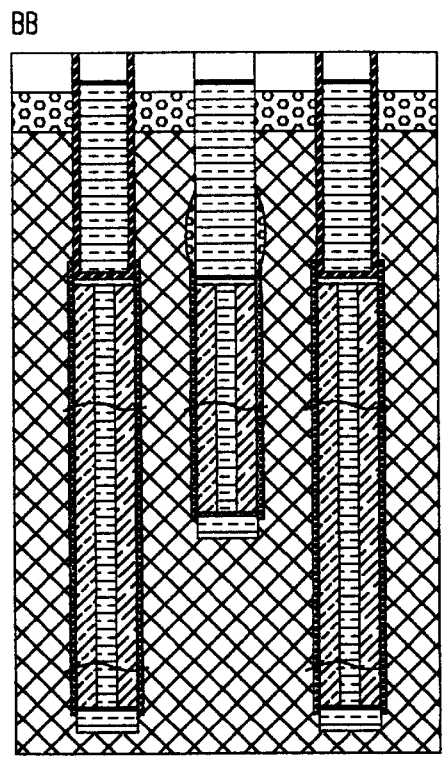

FIGS. 14, 14A and 14B show the deposition of a passivation layer and the patterning thereof to open the oxide adjacent a nitride spacer 131 to allow a connection to be made to the polysilicon plug which forms a common gate electrode and connection for transistors formed in adjacent silicon pillars 76. The word lines can thus be formed in the openings or on the surface of the passivation layer and connections made through the openings by any convenient process such as damascene or dual damascene processes.

Figure 15:
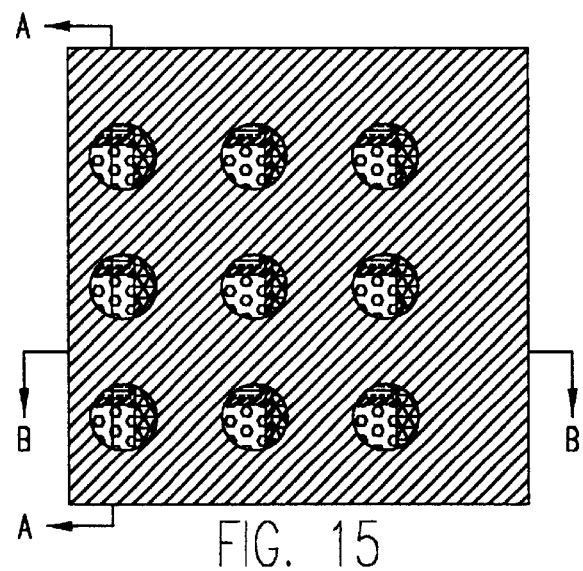
Figure 15A:
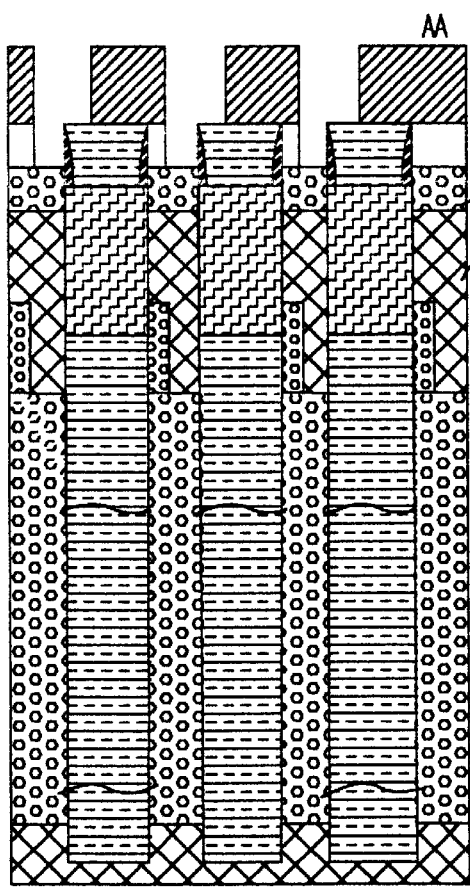
Figure 15B:
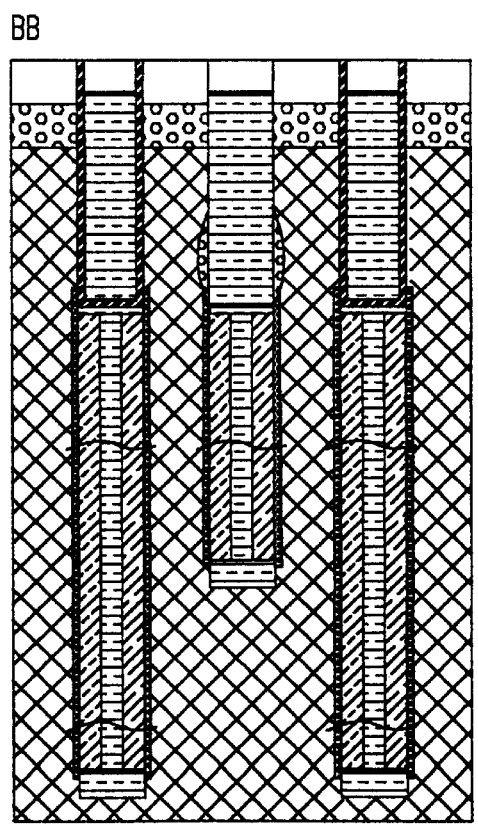

Similarly, as shown in FIGS. 15, 15A and 15B openings may be formed at other locations isolated from the polysilicon plugs to form connections to regions of doped polysilicon that forms the source/drain in the upper portion of a silicon pillar 76. These connections form the bit line connections to the respective memory cells. Similar connections can be made to the common capacitor electrodes to form inputs A and B of FIG. 1 at virtually any other location on the chip.

It should be noted that the opening for a connection to the silicon pillars as illustrated in FIGS. 14, 14A and 14B is made by etching oxide selectively to nitride below the passivation layer. Conversely, it should be noted that the openings for connections to the polysilicon plugs as illustrated in FIGS. 15, 15A and 15B are made by etching nitride selectively to oxide. Therefore, these openings are made by mutually exclusive processes and the formation of the respective openings are thus made independent of each other and can thus be formed at sub=lithographic sizes and/or spacings.

In view of the foregoing, it is seen that the invention provides for the storage and retrieval of the equivalent of two or three bits in a multi-level storage cell occupying only four lithographic squares. The size of the lithographic squares can be reduced as higher resolution lithographic processes, techniques and exposure tools become available. The memory cell design provides for internal integration of four or eight discrete and easily discriminated voltage levels derived from only two commonly referenced voltage sources and which provide high immunity from noise. Digital logic voltage values can be directly input simultaneously on three separate inputs in a short write cycle which does not require digital to analog conversion.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A method of operating a multi-level memory cell having a first storage capacitor and a second storage capacitor, said first storage capacitor having a value different from a value of said second storage capacitor and first and second transistors connected in series with a terminal of said first storage capacitor and said second storage capacitor, respectively, said method comprising steps of driving said first and second transistors to a conductive state, and simultaneously storing a logic level voltage on said first storage capacitor and said second storage capacitor whereby a multi-level signal may be read from said memory cell.

2. A method as recited in claim 1, including a further step of applying another logic level voltage different from said logic level voltage to a bit line of said memory cell.

3. A multi-level memory cell comprising two storage capacitors having differing values, two transistors respectively connected in series with a first terminal of each of said storage capacitors and a bit line of said memory cell, and means for applying one of a first logic level voltage and a second logic level voltage to each of said bit line and second terminals of respective ones of said two storage capacitors.

4. A memory cell as recited in claim 3, wherein a gate electrode of each of said two transistors is connected to a word line.

5. A memory cell as recited in claim 3, wherein said two transistor are formed at lateral sides of respective adjacent vertical semiconductor pillars.

6. A memory cell as recited in claim 5, wherein said two storage capacitors are formed on opposite respective sides of said respective adjacent semiconductor pillars.

7. A memory cell as recited in claim 6, wherein said two storage capacitors include a region in said semiconductor pillars including a dopant diffused therein from a diffusion source.

8. A memory cell as recited in claim 4, wherein said two transistors have gates formed by a semiconductor plug between said two adjacent semiconductor pillars.

9. A memory cell as recited in claim 8, further including a doped semiconductor connection regions at diagonally opposed corners of a semiconductor pillar between a surface of one of said silicon pillars including one of said transistors and a surface of said one of said semiconductor pillars including a corresponding one of said two storage capacitors and forming said series connection of said transistor to said corresponding storage capacitor.

10. A memory cell as recited in claim 6, wherein said two transistors have gates formed by a semiconductor plug between said two adjacent semiconductor pillars.

11. A memory cell as recited in claim 10, further including a doped semiconductor connection regions at diagonally opposed corners of a semiconductor pillar between a surface of one of said silicon pillars including one of said transistors and a surface of said one of said semiconductor pillars including a corresponding one of said two storage capacitors and forming said series connection of said transistor to said corresponding storage capacitor.

* * * * *